United States Patent
Cheng et al.

(10) Patent No.: US 6,174,760 B1
(45) Date of Patent: Jan. 16, 2001

(54) METHOD OF IMPROVING VERTICAL BJT GAIN

(75) Inventors: Yao-Chin Cheng, Chi-Lung; Sheng-Hsing Yang, Hsin-Chu, both of (TW)

(73) Assignee: United Microelectronics Corp., Hsin-Chu (TW)

( * ) Notice: Under 35 U.S.C. 154(b), the term of this patent shall be extended for 0 days.

(21) Appl. No.: 09/314,525

(22) Filed: May 19, 1999

(51) Int. Cl.$^7$ ................................................ H01L 21/8249
(52) U.S. Cl. ............................................ 438/202; 438/234
(58) Field of Search ...................................... 438/235, 234, 438/202, 203, 204, 205, 206, 236

(56) References Cited

U.S. PATENT DOCUMENTS

| | | | |
|---|---|---|---|
| 4,120,707 | * | 10/1978 | Beasom . |
| 5,780,329 | * | 7/1998 | Randazzo et al. . |
| 5,866,446 | * | 2/1999 | Inoh . |
| 6,030,864 | * | 2/2000 | Appel et al. . |
| 6,071,767 | * | 7/2000 | Monkowski et al. . |

* cited by examiner

Primary Examiner—Tuan H. Nguyen
(74) Attorney, Agent, or Firm—Harness, Dickey & Pierce, P.L.C.

(57) ABSTRACT

In one embodiment, the present invention is provided for higher BJT gain and more quality device. Providing a substrate incorporating a device, wherein the device is defined MOS region and BJT region. Conductivity-type well region is formed on the substrate, and then a gate oxide layer is formed on the conductivity-type well region of MOS region. Consequently, a polysilicon layer is deposited on the gate oxide layer of MOS region. Using photolithographic and etching process to define a gate, wherein the polysilicon layer is used as the gate of MOS region. Further implanting ions of a first conductive type into the substrate of MOS region. A first dielectric layer is forming on sidewall of the gate, wherein the first dielectric layer is used as a spacer of MOS region. Sequentially, a first photoresist layer is formed over substrate of BJT region to define an emitter of BJT. Then implanting second ions of the first conductive type into the substrate of MOS region to form source/drain regions by using said spacer as a mask. Simultaneously implanting second ions of the first conductive type into the substrate to form the emitter of BJT. Sequentially, a second photoresist layer is deposited over the device of the MOS region. Finally, implanting third ions of the first conductive type into the emitter of BJT inside the substrate.

13 Claims, 5 Drawing Sheets

METHOD OF IMPROVING VERTICAL BJT GAIN

BACKGROUND OF THE INVENTION

1. Field of the Invention

The present invention relates to a complementary metal-oxide semiconductor CMOS, and more particularly, to a bipolar junction transistor BJT for compatible high gain gated lateral BJT and more quality device.

2. Description of the Prior Art

Recently, demand for semiconductor devices has rapidly increased owing to widespread use of integrated electronic circuit. In particularly, static random access memory (SRAM) has become a basic and elementary component used in integrated circuits (ICs), such as semiconductor memory devices. More particularly, as more than hundreds or thousands of electrical components are integrated into the ICs, a means for scaling down the dimension of the SRAM and reducing fabrication cost has become imperative.

The conventional CMOS SRAM cell essentially consists of a pair of cross-coupled inverters as the storage flip-flop or latch, and a pair of passes transistors as the access devices for data transfer into and out of the cell. Thus, a total of six Metal Oxide Semiconductor Field Effect Transistors (MOSFETs) or four MOSFETs plus two very high resistance load devices are required for implementing a conventional CMOS SRAM cell. However, to achieve high packing density, it is the usual practice to reduce the number of the devices needed for realizing a CMOS SRAM cell or the number of the devices for performing the Write/Read operation. Especially for the case of very high resistance load devices, increased process complexity, extra masks, and high fabrication cost are required for forming the undoped polysilicon layers or the Thin Film Transistor (TFT) on the oxide and thus saving the chip area; however, the corresponding product yield is not high. Therefore, more efforts are needed to further reduce the areas occupied by the chip while improving the production yield.

In the realm of microwave transistors, both bipolar and field effect transistors, higher frequency performance has required narrower and narrower line width. Bipolar IC technology has traditionally been the choice technology for high-speed application. This is partly due to the face that in this technology transit time is determined by the base width of the bipolar device. And the base width not being determined by lithography as is the case with the channel length of MOS devices, but rather by the difference between the impurity diffusion profiles of the emitter and base. In the BJT device structure, a reduction in line width corresponding reduction in the overall bases area. With the overall objective of reduction of capacitance between the junctions, in particular the emitter base junction, the result is shorter emitter base charging times, as well as a reduced transit time across the base. Time translates into an increase in overall device switching speeds and frequency characteristics.

The single material BJT, traditionally silicon, has been the choice technology for high-speed application. This is due in part to the fact that this technology enables transit times that are determined by the base width of the bipolar device.

Designer needs to use BJT in Bandgap Reference and Voltage Regulator circuits. It is more important to make BJT fabrication on CMOS chip. Vertical PNP (P$^+$/N-well/P-sub) is used as a BJT compatible with current CMOS technology. Due to higher well concentration is need when shrinking device gate length, vertical BJT gain (p) is getting smaller.

Table 1 (Appendix) shows BJT current gain in three different generation technologies.

For the foregoing reasons, there is a need for a method forming higher BJT gain in deep sub-quarter micro CMOS technology. Appendix:

TABLE 1

| Vertical PNP β gain in different technology | | | | |
|---|---|---|---|---|
| Technology | N well $X_j$ (μm) | P$^+$ $X_j$ (μm) | Rs-N well (Ω/square) | Vertical PNP β gain |
| 0.45 | 2.7 | 0.25 | 724 | 5 |
| 0.35 | 2.9 | 0.18 | 700 | 3.5 |
| 0.25 | 1.8 | 0.18 | 400 | 2.1 |

SUMMARY OF THE INVENTION

In accordance with the present invention, a vertical Bipolar Junction Transistor BJT method is provided for higher BJT gain and more quality device.

Another purpose of the present invention is to have P-type specie, which is only implanted in BJT region. Using different implanted dosage and energy to form a higher BJT gain. For example, P-type ions of the first conductive type is implanted into the emitter of BJT inside the semiconductor substrate, wherein concentration of the implanted P-type ions is about $1E^{13}/cm^3$ to $5E^{15}/cm^3$ and energy of the implanted P-type ions is about 20K eV to 60K eV. And depth of the Ptype implant must be deeper than source/drain implant. Therefore, different implanted dosage and energy will result in different improvements. The method is efficient and compatible with CMOS technology.

In one embodiment, the present invention is provided for higher BJT gain and more quality device. Providing a semiconductor substrate incorporating a device, wherein the device is defined metal oxide semiconductor (MOS) region and bipolar junction transistor (BJT) region. Conductivity-type well region is formed on the semiconductor substrate, and then a gate oxide layer is formed on the conductivity-type well region of MOS region. Consequently, a polysilicon layer is deposited on the gate oxide layer of MOS region. Using photolithographic and etching process to define a gate structure, wherein the polysilicon layer is used as the gate of MOS region. Further implanting ions of a first conductive type into the semiconductor substrate of MOS region. A first dielectric layer is forming on sidewall of the gate, wherein the first dielectric layer is used as a spacer of MOS region. Sequentially, a first photoresist layer is formed over semiconductor substrate of BJT region to define an emitter of BJT. Then implanting second ions of the first conductive type into the semiconductor substrate of MOS region to form source/drain regions by using said spacer as a mask. Simultaneously implanting second ions of the first conductive type into the semiconductor substrate to form the emitter of BJT. Sequentially, a second photoresist layer is deposited over the device of the MOS region. Finally, implanting third ions of the first conductive type into the emitter of BJT inside the semiconductor substrate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
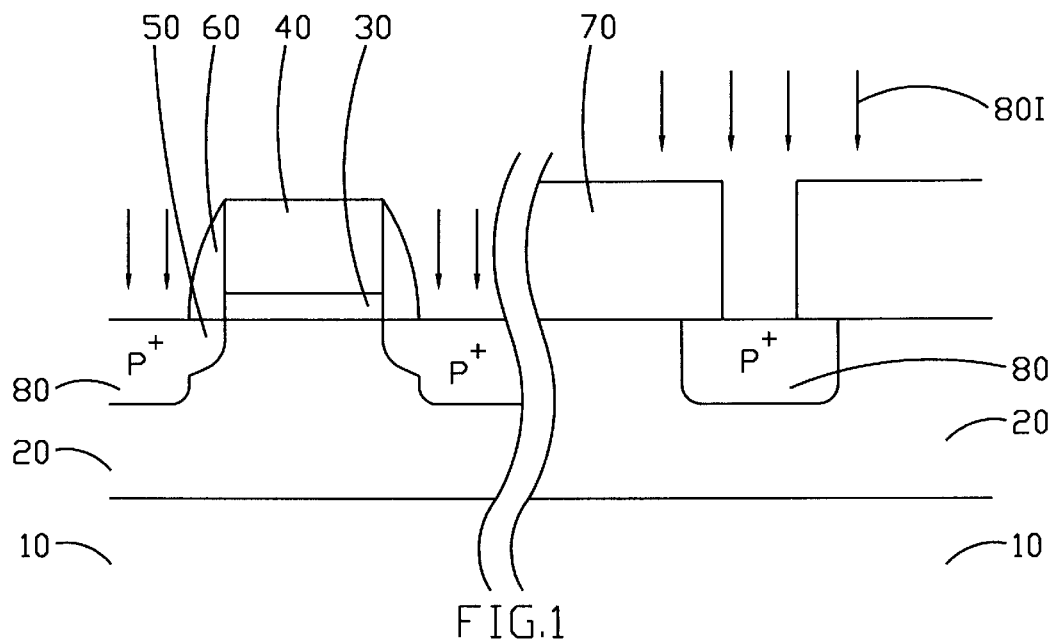
FIGS. 1 to 2 show cross-sectional views of various stages in the fabrication of a traditional semiconductor device in accordance with one embodiment of the present invention.

Referring to FIG. 1, a semiconductor substrate is provided incorporating a device, and a conductivity-type well region 20 is formed adjacent to a P-type silicon substrate 10. The conductivity-type well region 20, for example, can be an N-type well. Wherein the device is defined metal oxide semiconductor (MOS) region and bipolar junction transistor (BJT) region. Consequentially, a gate oxide layer 30 is formed on the conductivity-type well region 20 of MOS region by using a traditional thermal method to grow the silicon oxide, where a thickness of about 100–250 angstroms. Subsequently, a conventional low-pressure chemical vapor deposition (LPCVD) is utilized to form a polysilicon layer 40 on the gate oxide 30. A polysilicon layer 40 with the thickness is preferably about 2000–3000 angstroms. Generally, the formation of the polysilicon layer 40 is implanted by doping ions, such as Phosphorus or Arsenic, so that the resistivity of the gate of MOS thus formed later can be substantially reduced. Using conventional photolithography techniques and etching process, the polysilicon layer 40 and the gate oxide layer 30 are etched to form a gate of MOS. Using the gate of MOS as a doping mask, ions such as Arsenic with concentration of about $1E^{13}/cm^3$ are implanted into the conductivity-type well region 20 of MOS region. And thus forming a lightly doped drain (LDD) region 50, which is mainly used to improve the short channel effect and is generally designated as P_. Further, forming a first photoresist layer over semiconductor substrate of BJT region to define an emitter of BJT. Using the spacer 60 as an implant mask, P type ions such as Phosphorus or Arsenic 80I are implanted into the conductivity-type well region of MOS region 20, thus forming heavily doped source/drain regions 80. The concentration of the implanted ions is about $1E^{15}/cm^3$, and is usually designated as $P_+$. It is noted that the concentration of the heavily doped regions 80 is higher than the concentration of the lightly doped region 50 mentioned above. Simultaneously implanting second ions of the first conductive type into the silicon substrate to form a BJT emitter, wherein concentration of the implanted second ions is about $1E^{15}/cm^3$ and energy of the implanted second ions is about 10K eV.

Figure 2:
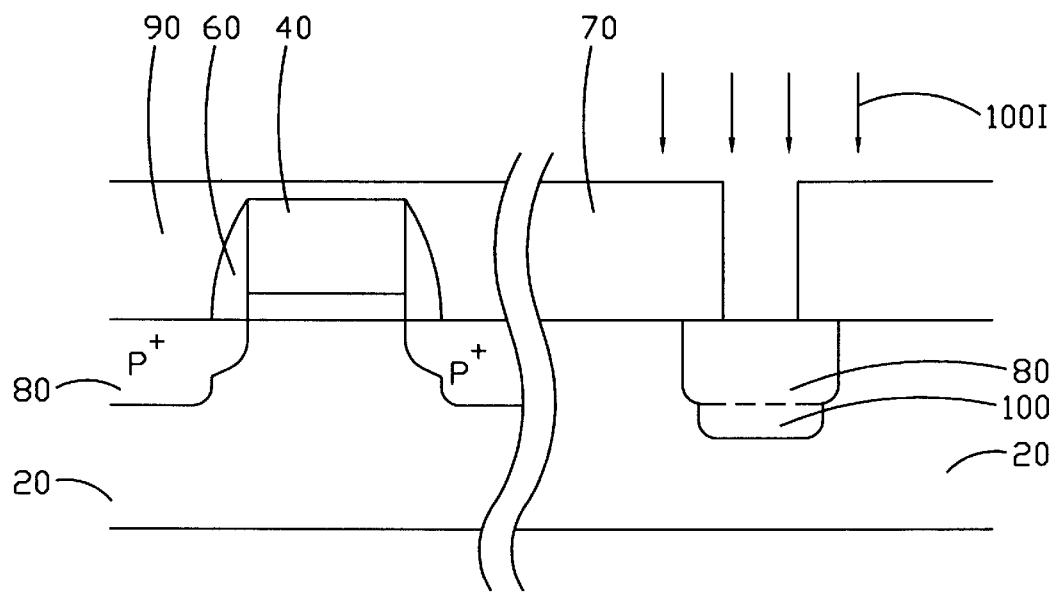

Referring to FIG. 2, a second photoresist layer is deposited over the device of the MOS region. Finally, third ions of the first conductive type 100I are implanted into the BJT emitter inside the semiconductor substrate and are generally designated as P_. Wherein concentration of the implanted third ions is about $1E^{13}/cm^3$ to $5E^{15}/cm^3$ and energy of the implanted third ions is about 20K eV to 60K eV.

Figure 3:
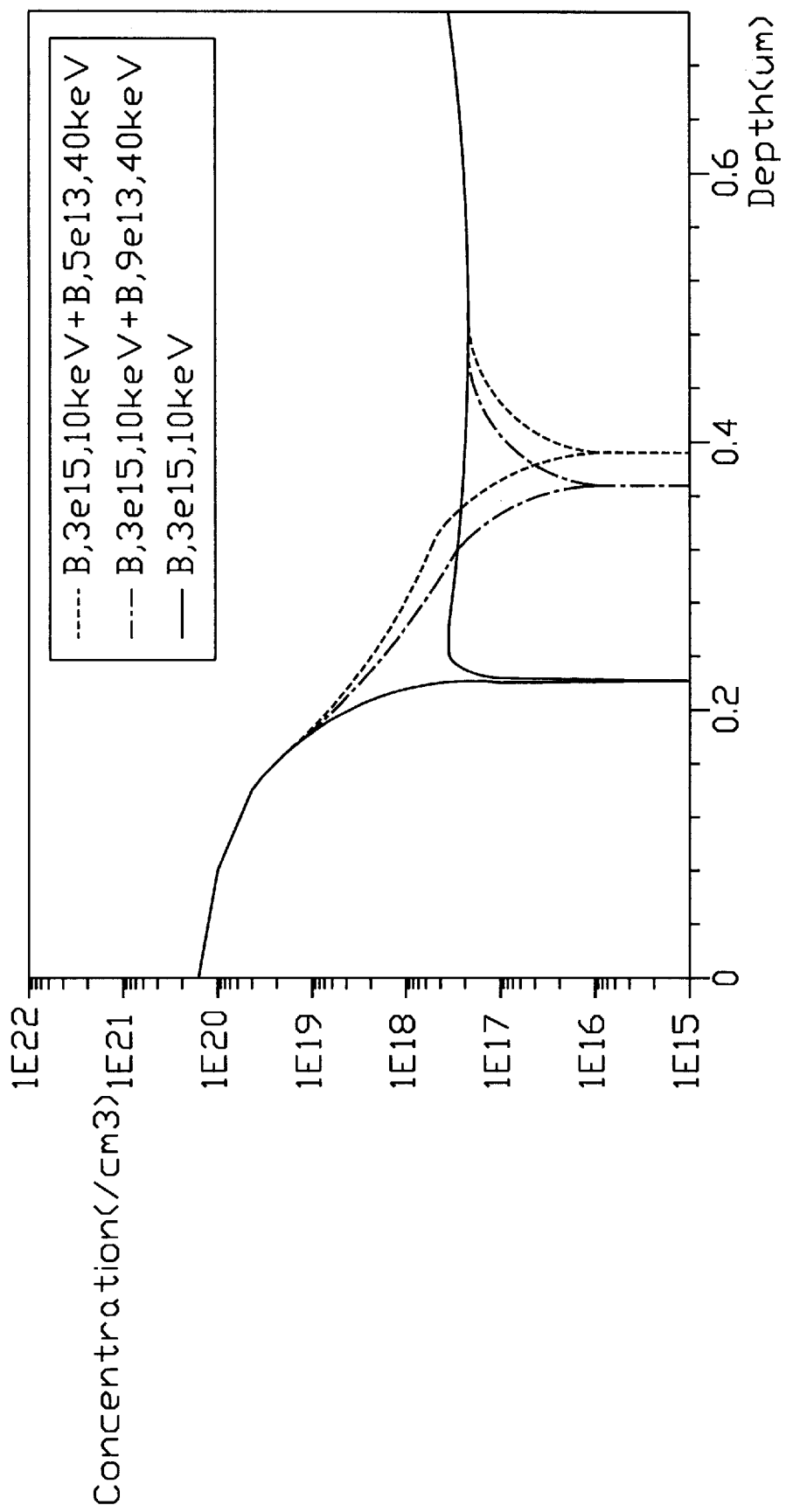
FIG. 3 show the implanted concentration vs. implanted depth is in the preferred embodiment of the invention.

The point of improving vertical BJT gain is using additional P⁻type implanted dosage to from a specific PNP profile, wherein the P⁻type implant is the third conductive type of BJT emitter. The relations of the concentration of BJT emitter and the depth of BJT emitter are show in the FIG. 3. In the embodiment, the implanted dosage is $3E^{15}$ and the implanted energy is 10K eV are baseline. Two different P⁻ of $9E^{13}$ 40K eV and $5E^{13}$ 40K eV implant profile are compared with baseline profile. Hence it is noted that the higher concentration is implanted deeper.

The corresponding β gain ($I_1/I_b$) VS. $V_{be}$ is in another preferred embodiment of the invention as following FIG. 4. Vertical PNP gain is improved by 16% due to introducing specific P⁻ of $9E^{13}$ 40K eV. Therefore the specific profile can make higher BJT β gain about 2.52 is show in the FIG. 4.

Figure 5:
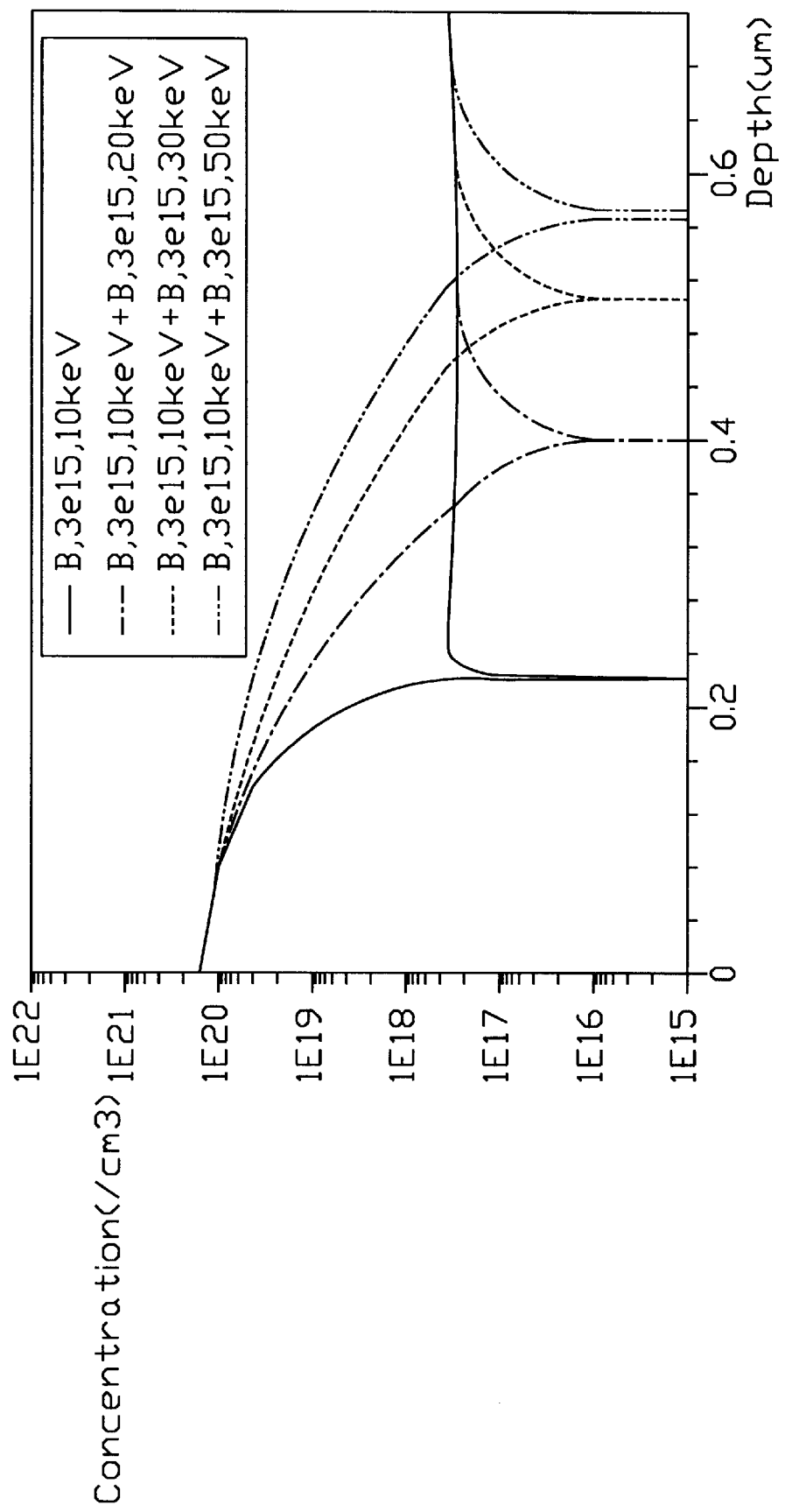
FIG. 5 show the implanted concentration vs. implanted depth is in another preferred embodiment of the invention.
Figure 6:
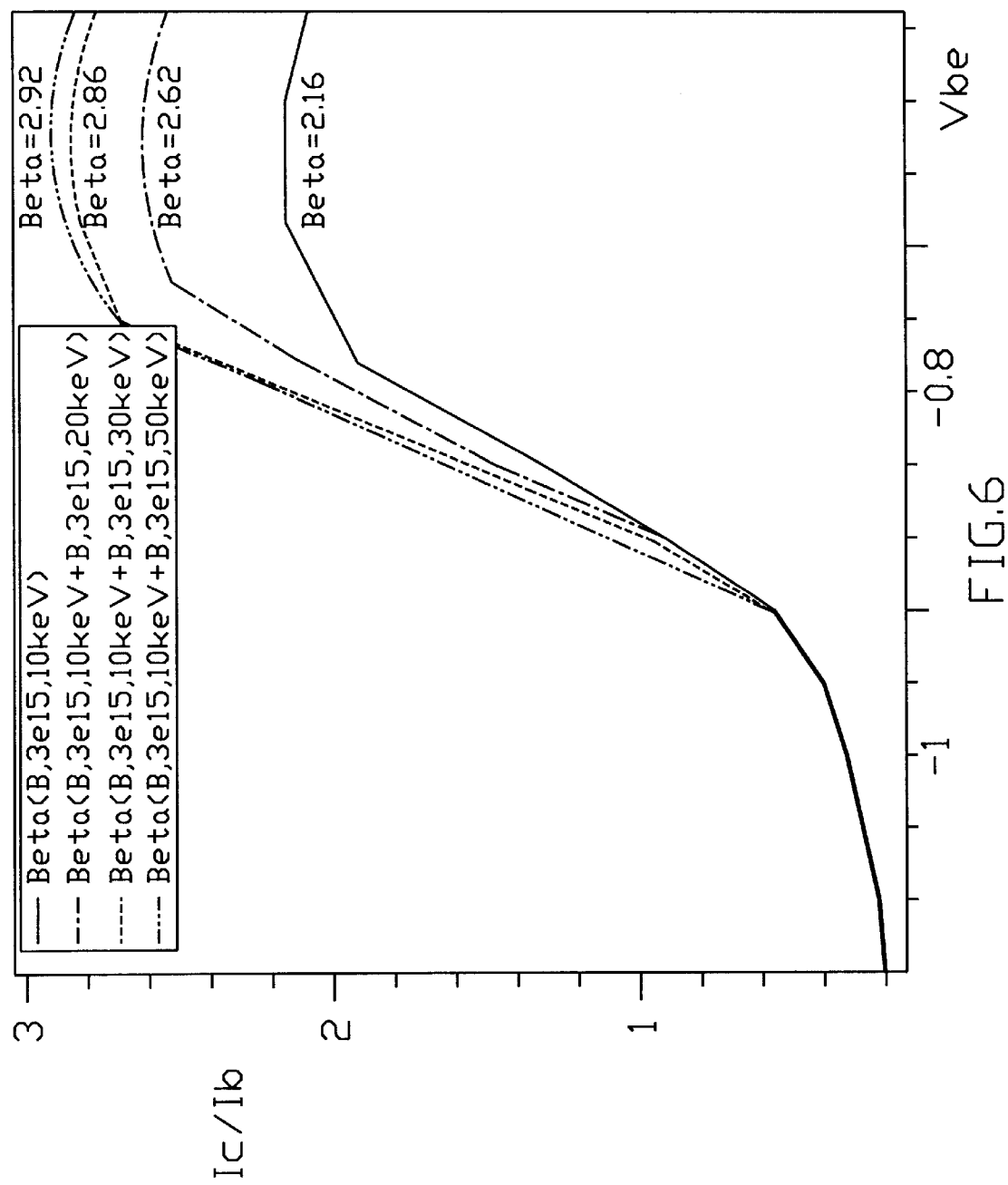
FIG. 6 show the corresponding β gain ($I_c/I_b$) vs. $V_{be}$ is in another preferred embodiment of the invention.

Further in another preferred embodiment of the invention, the point of improving vertical BJT gain is using additional P⁻type implanted energy to from a specific PNP profile in the same P⁻type implanted dosage, wherein the P-type implant is the third conductive type of BJT emitter. The relations of the concentration of BJT emitter and the depth of BJT emitter are show in the FIG. 5. In the embodiment, the implanted dosage is $3E^{15}$ and the implanted energy is 10K eV are baseline. Three different P⁻ of $3E^{15}$ 20K eV, $3E^{15}$ 30K eV, and $3E^{15}$ 50K eV implant profile are compared with baseline profile. Hence it is noted that the higher energy is implanted deeper as like the profile of $3E^{15}$ 50K eV. Whereas implanted energy is a certain depth, the degree of improvement is not better.

Figure 4:
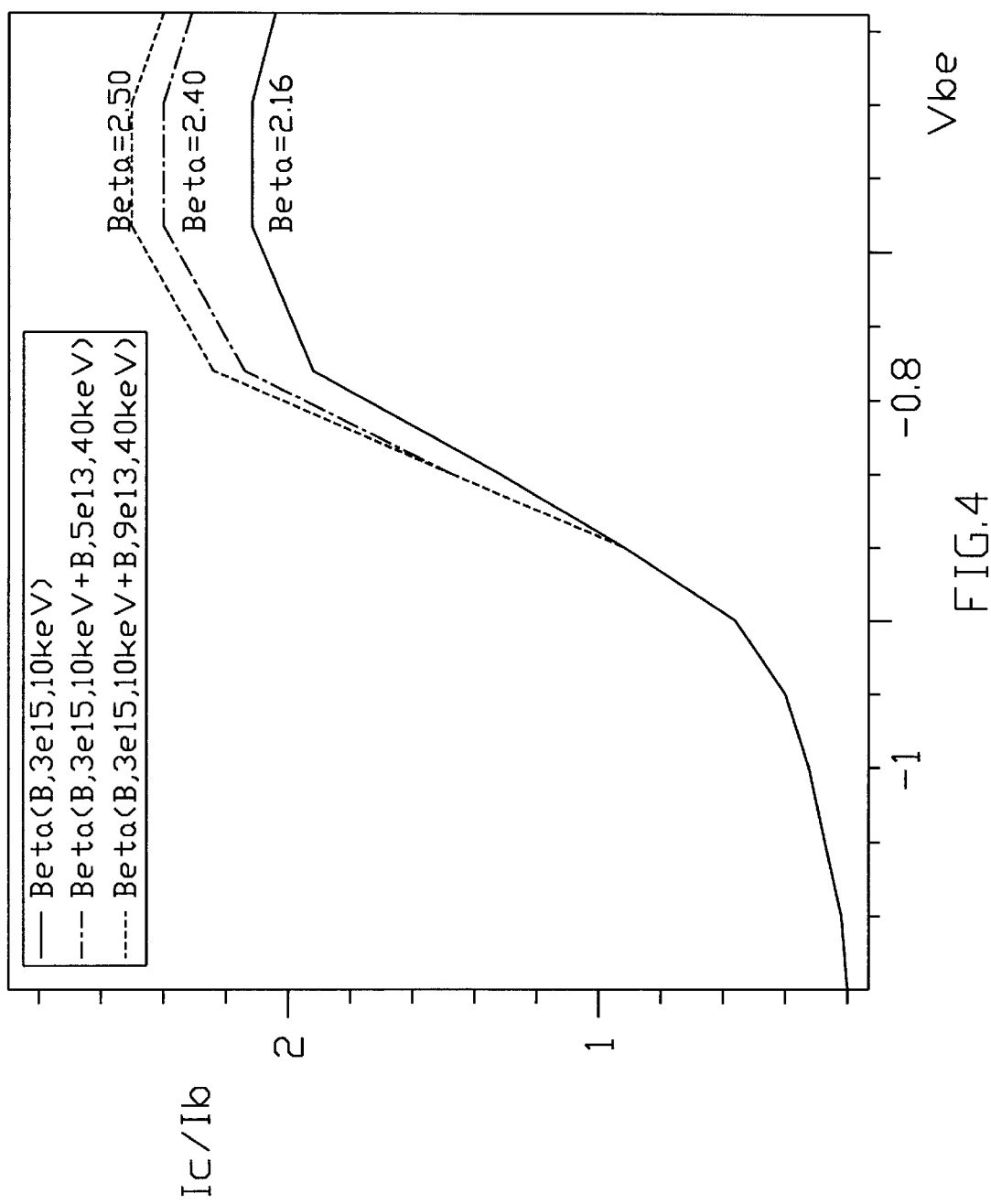
FIG. 4 show the corresponding β gain ($I_c/I_b$) vs. $V_{be}$ is in the preferred embodiment of the invention.

The corresponding β gain ($I_1/I_b$) vs. $V_{be}$ is as following FIG. 4. By proper modification of P⁻ implanted emerge, vertical BJT gain can be improved by 36%. Vertical PNP gain is improved by 36% due to introducing specific P⁻ of $3E^{15}$ 50K eV. The additional P⁻ implanted dosage does not only reduce and implanted width is improved and higher β gain is obtained.

Although specific embodiments have been illustrated and described, it will be obvious to those skilled in the art that various modifications may be made without departing from what is intended to be limited solely by the appended claims.

What is claimed is:

1. A method for forming a semiconductor device, said method comprising:
   providing a semiconductor substrate incorporating a device, wherein said device is defined metal oxide semiconductor (MOS) region and bipolar junction transistor (BJT) region;
   forming a conductivity-type well region on the semiconductor substrate;
   forming a gate oxide layer on said conductivity-type well region of MOS region;
   depositing a polysilicon layer on said gate oxide layer of MOS region;
   using photolithographic and etching process to define a gate structure, wherein the polysilicon layer is used as said gate of MOS region;
   implanting ions of a first conductive type into the semiconductor substrate of MOS region;
   forming a first dielectric layer on side wall of the gate, wherein said first dielectric layer is used as a spacer of MOS region;
   forming a first photoresist layer over semiconductor substrate of BJT region to define a emitter of BJT;
   implanting second ions of the first conductive type into the semiconductor substrate of MOS region to form source/drain regions by using said spacer as a mask;
   simultaneously implanting second ions of the first conductive type into the semiconductor substrate to form said emitter of BJT;
   depositing a second photoresist layer over the device of the MOS region; and implanting third ions of the first conductive type into said emitter of BJT inside the semiconductor substrate.

2. The method according to claim 1, wherein said gate comprises polysilicon.

3. The method according to claim 1, wherein said first dielectric layer comprises silicon nitride.

4. The method according to claim 1, wherein concentration of said implanted second ions is greater than concentration of said implanted first ions of MOS region.

5. The method according to claim 1, wherein energy of said implanted third ions is greater than energy of said implanted second ions of BJT region.

6. The method according to claim 1, wherein said conductivity-type well region is an N-well.

7. The method according to claim 1, wherein second ions of the first conductive type of MOS and BJT regions are chosen from an P-type ion group consisting of boron, and boron fluoride ions.

8. The method according to claim 1, wherein third ions of the first conductive type of BJT region are chosen from an P-type ion group consisting of boron, and boron fluoride ions.

9. A method for forming a semiconductor device, said method comprising:

providing a silicon substrate incorporating a device, wherein said device is defined metal oxide semiconductor (MOS) region and bipolar junction transistor (BJT) region;

forming a N well region on the silicon substrate;

forming a gate oxide layer on said N well region of MOS region;

depositing a polysilicon layer on said gate oxide layer of MOS region;

using photolithographic and etching process to define a gate structure, wherein the polysilicon layer is used as said gate of MOS region;

implanting ions of a first conductive type into the silicon substrate of MOS region;

forming a silicon nitride layer on side wall of the gate, wherein said silicon nitride layer is used as a spacer of MOS region;

forming a first photoresist layer over semiconductor substrate of BJT region to define a emitter of BJT;

implanting second ions of the first conductive type into the silicon substrate of MOS region to form source/drain regions by using said spacer as a mask, wherein concentration of said implanted second ions is about $1E^{15}/cm^3$;

simultaneously implanting second ions of the first conductive type into the silicon substrate to form said emitter of BJT, wherein concentration of said implanted second ions is about $1E^{15}/cm^3$ and energy of said implanted second ions is about 10K eV;

depositing a second photoresist layer over the device of the MOS region; and implanting third ions of the first conductive type into said emitter of BJT inside the semiconductor substrate, wherein concentration of said implanted third ions is about $1E^{13}/cm^3$ to $5E^{15}/cm^3$ and energy of said implanted third ions is about 20K eV to 60K eV.

10. The method according to claim 9, wherein said gate oxide layer is formed by a thermal oxide method.

11. The method according to claim 9, wherein said polysilicon gate is doped with ions Phosphorus or Arsenic.

12. The method according to claim 9, wherein said second ions and third ions of the first conductive type of BJT regions are chosen from an P-type ion group consisting of boron, and boron fluoride ions.

13. The method according to claim 9, wherein said third ions of the first conductive type is deeper than second ions of the first conductive type of the BJT regions inside the silicon substrate.

* * * * *